(12) United States Patent
Shirley et al.

(10) Patent No.: US 8,124,326 B2
(45) Date of Patent: Feb. 28, 2012

(54) METHODS OF PATTERNING POSITIVE PHOTORESIST

(75) Inventors: Paul D. Shirley, Meridian, ID (US); Hiroyuki Mori, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 423 days.

(21) Appl. No.: 12/396,941

(22) Filed: Mar. 3, 2009

(65) Prior Publication Data

US 2010/0227282 A1 Sep. 9, 2010

(51) Int. Cl.
G03F 7/26 (2006.01)

(52) U.S. Cl. .......................... 430/322; 430/328; 430/394

(58) Field of Classification Search .................. 430/311, 430/322, 394, 328, 312
See application file for complete search history.

(56) References Cited

U.S. PATENT DOCUMENTS

| | | | |
|---|---|---|---|
| 5,158,860 A | 10/1992 | Gulla et al. | |
| 5,294,562 A | 3/1994 | Lur et al. | |
| 5,905,019 A * | 5/1999 | Obszarny | 430/327 |
| 6,040,118 A * | 3/2000 | Capodieci | 430/328 |
| 6,225,019 B1 | 5/2001 | Matsuda et al. | |
| 6,329,306 B1 | 12/2001 | Nakao | |
| 6,383,719 B1 | 5/2002 | Bula et al. | |
| 6,645,851 B1 | 11/2003 | Ho et al. | |
| 6,943,124 B1 | 9/2005 | Lu et al. | |

* cited by examiner

*Primary Examiner* — Kathleen Duda
*Assistant Examiner* — Caleen Sullivan
(74) *Attorney, Agent, or Firm* — Wells St. John P.S.

(57) ABSTRACT

A method of patterning positive photoresist includes providing positive photoresist over a substrate. An area of the positive photoresist is exposed to a pattern of activating radiation at a dose which is below the Dose To CD of the pattern with the positive photoresist. The area of the positive photoresist is flood exposed to activating radiation at a dose from 1% to 75% of $E_0$. A sum of the flood dose and the pattern dose is less than the Dose To CD yet effective to resolve the pattern in the positive photoresist upon develop. After exposing the area to the flood dose and the pattern dose, the area of the positive photoresist is developed to resolve the pattern in the positive photoresist. Other embodiments are contemplated.

33 Claims, 2 Drawing Sheets

METHODS OF PATTERNING POSITIVE PHOTORESIST

TECHNICAL FIELD

Embodiments disclosed herein pertain to methods of patterning positive photoresist.

BACKGROUND

Integrated circuitry fabrication typically involves lithographic processing to transfer patterns formed in an imaging layer to an underlying substrate material which will form part of the finished circuitry. One example process is photolithography wherein the imaging layer comprises photoresist. A form of radiant energy is passed through a radiation-patterning tool and onto the photoresist. The radiation-patterning tool is commonly referred to as mask, photomask, or reticle. The term "photomask" has traditionally been used to refer to masks which define a pattern for an entire side of a substrate, while the term "reticle" traditionally refers to a masking tool which defines a pattern for only a portion of a side of a substrate.

A reticle typically encompasses multiple die/chip areas of the substrate being patterned. The reticle and substrate bearing the photoresist are moved relative to one another such that multiple discrete exposures of the substrate through the reticle completely patterns the entire side of the substrate. The time required to completely pattern one side of a substrate for a given masking step totals the time it takes to move the reticle and substrate relative to one another in combination with the time of radiation exposure through the reticle between movements. The equipment used to accomplish such is very expensive. Accordingly, anything that can be done to reduce the time of the individual exposures would increase the throughput of the tool.

While the invention was motivated in addressing the above-identified issues, the invention is no way limited.

DETAILED DESCRIPTION OF EXAMPLE EMBODIMENTS

Figure 1:
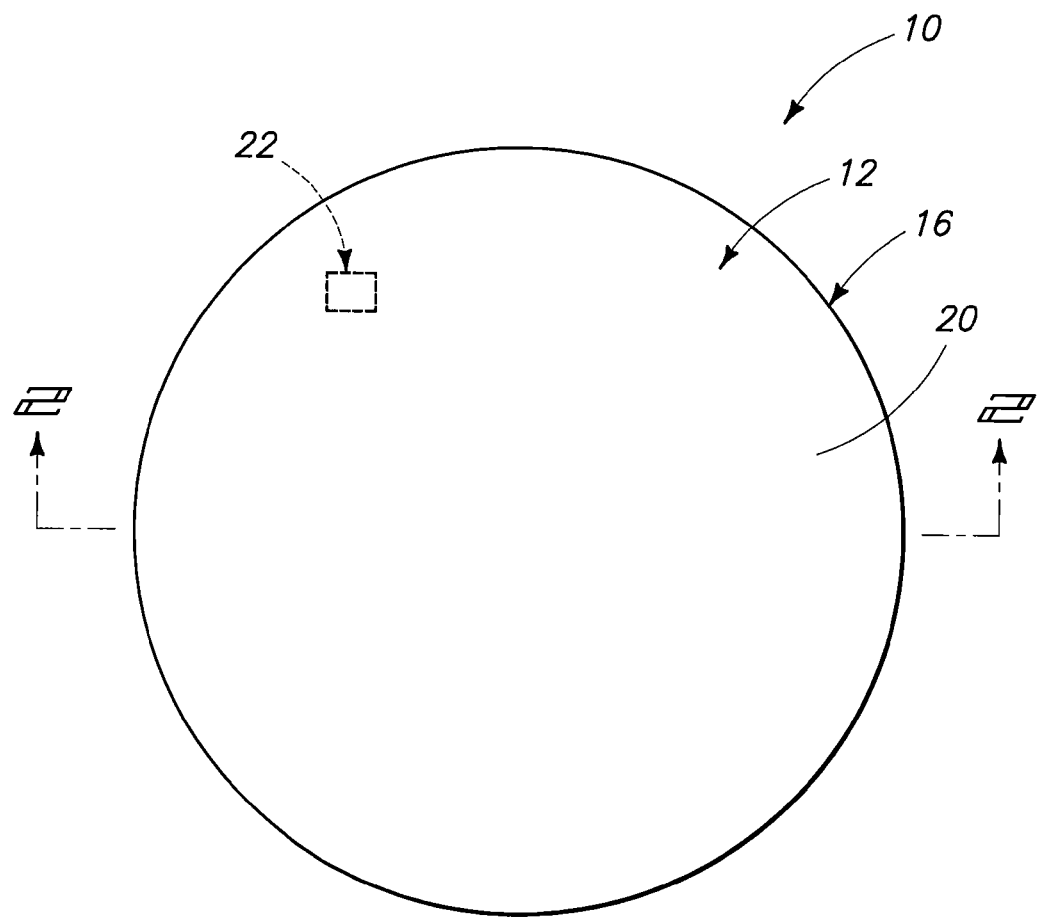
FIG. 1 is a diagrammatic top plan view of a substrate at a processing step in accordance with an embodiment of the invention.
Figure 2:
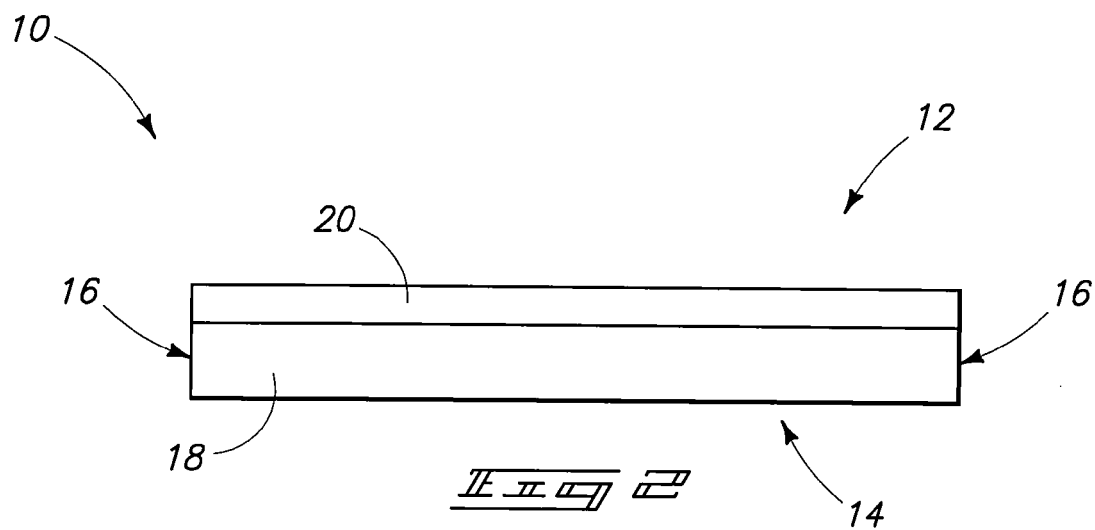
FIG. 2 is a diagrammatic sectional view taken through line 2-2 in FIG. 1.

Example embodiments of methods of patterning positive photoresist are described with reference to FIGS. 1-5. Referring initially to FIGS. 1 and 2, a semiconductor wafer is indicated generally with reference numeral 10, and for example as might ultimately be fabricated to form integrated circuitry. Wafer 10 may comprise semiconductor material and/or other material. Accordingly, wafer 10 may constitute a semiconductor substrate or other substrate. In the context of this document, the term "semiconductor substrate" or "semiconductive substrate" is defined to mean any construction comprising semiconductive material, including, but not limited to, bulk semiconductive materials such as a semiconductive wafer (either alone or in assemblies comprising other materials thereon), and semiconductive material layers (either alone or in assemblies comprising other materials). The term "substrate" refers to any supporting structure, including, but not limited to, the semiconductive substrates described above.

Wafer/substrate 10 is depicted as comprising a substrate 18 over which positive photoresist 20 has been provided. Substrate 18 may be considered as comprising opposing sides 12, 14, and an encircling edge 16. Other configuration shapes and/or substrates are contemplated. In the depicted example, positive photoresist 20 is a coating covering an entirety of side 12 of opposing sides 12, 14 of substrate 18. Alternately, positive photoresist 20 might cover less than an entirety of at least one of opposing sides of the substrate.

In one embodiment, positive photoresist 20 will be patterned at least in part in a step-like manner using a reticle. For example and by way of example only, a photoscanner/stepper tool may be used wherein small, discrete areas of positive photoresist 20 are successively exposed through a reticle. The wafer and reticle are caused to move relative one another such that the reticle passes over the entirety of one side of the substrate in a step-like manner, with activating radiation being caused to pass through the reticle at each step. By way of example only, FIG. 1 depicts an example reticle outline 22.

An area of the positive photoresist is exposed to a pattern of activating radiation at a dose which is below the Dose To CD of such pattern with such positive photoresist. In the context of this document, CD has its ordinary meaning of "critical dimension" which is the smallest feature dimension in the pattern. In the context of this document, "Dose To CD" has its ordinary meaning which is the amount of exposure energy required to produce such pattern upon develop in the particular positive photoresist received over the substrate. Variables that impact Dose To CD include photoresist composition, photoresist thickness, wavelength of incident radiation, the pattern being created, the CD within such pattern, and the numerical aperture of the lens system used with the reticle or other mask through which the pattern is created. The area of the positive photoresist which is exposed to the pattern of activating radiation may encompass an entirety of one side of the substrate. Alternately, the area of exposure may encompass less than an entirety of one side of the substrate, for example through a reticle and lens system received over only a portion of the substrate.

In one embodiment, the pattern dose is from 50% to 95% of the Dose To CD, in one embodiment is less than or equal to 90% of the Dose To CD, in one embodiment less than or equal to 80% of the Dose To CD, and in one embodiment less than or equal to 70% of the Dose To CD.

Figure 3:
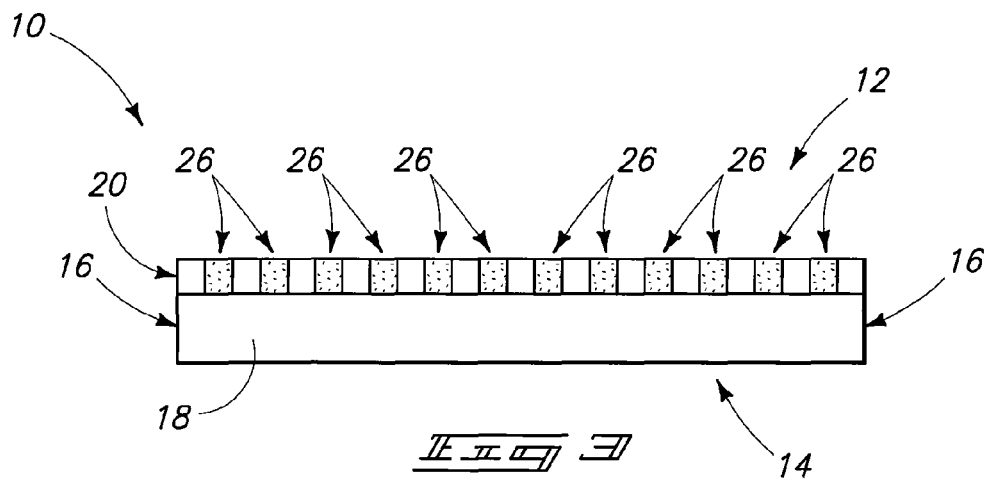
FIG. 3 is a view of the FIG. 2 substrate at a processing step subsequent to that shown by FIG. 2.

FIG. 3 depicts one example of wafer/substrate 10 wherein some area of positive photoresist 20 has been exposed to a pattern of activating radiation at a dose which is below the Dose To CD. The dose is however effective to form a pattern in positive photoresist 20 which will not resolve upon exposure to a developer chemistry. For example, positive photoresist 20 in FIG. 3 is depicted as having regions 26 resulting from exposure through openings in a mask (not shown) of the pattern, thereby producing radiation-exposed regions 26 which are shown with stippling in the drawing. Such are depicted as diagrammatic only, with more likely thousands or millions of such patterned features being received in the depicted cross-section across wafer/substrate 10. Example regions 26 are shown by stippling to extend completely through positive photoresist 20. Alternately, such activating radiation may have been insufficient to extend the radiation/ stippling completely through the thickness of positive photoresist 20. Regardless, the dose or quanta of activating radiation has been ineffective to enable the depicted pattern of features 26 in positive photoresist 20 to be wholly or partially removed in a suitable developer which would otherwise enable the pattern to be resolved/created in such photoresist to be usable as a mask pattern.

FIG. 3 depicts or implies that the area exposed to the pattern of activating radiation is the entirety of substrate side 12, and whether occurring all at one time or over discrete periods of time and regardless of whether using a photomask or reticle to do so. However, the area exposed to the pattern of activating radiation may encompass less than an entirety of substrate side 12.

Figure 4:
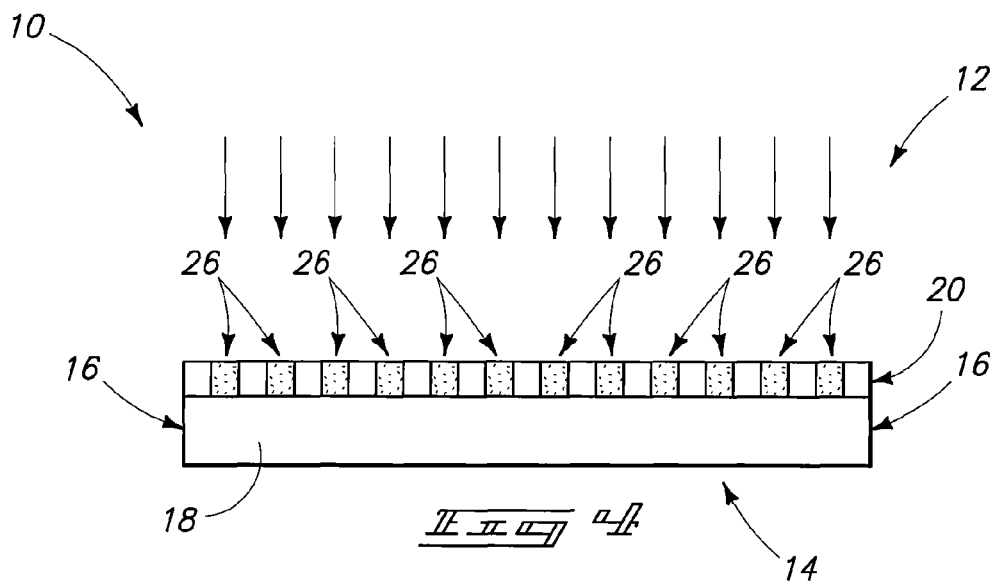
FIG. 4 is a view of the FIG. 3 substrate at a processing step subsequent to that shown by FIG. 3.

Referring to FIG. 4, the area of positive photoresist which was subjected to the pattern of activating radiation at a dose which was below the particular Dose To CD has now been flood exposed to activating radiation at a dose from 1% to 75% of $E_0$. Such is intended to be depicted by the vertical, down arrows. In this document, $E_0$ has its normal meaning of Dose To Clear which is the amount of exposure energy required to just clear the particular resist layer in a large clear area in the absence of patterning in such large area of exposure. Reference to "flood" exposure also refers to energy exposure of some large clear area in the absence of passing through a mask pattern in such large area. In one embodiment, the flood dose is from 5% to 65% of $E_0$, and in one embodiment from 10% to 50% of $E_0$. In one embodiment, the flood dose is from 1 mj to 10 mj. In one embodiment, a sum of the flood dose and the pattern dose is less than the Dose To CD yet effective to resolve the pattern in the positive photoresist upon develop. Such can be determined by trial and experimentation before, for example, undertaking high volume production.

The area subjected to the flood exposing may be an entirety of one of opposing sides of the substrate, or less than an entirety of one of the opposing sides of the substrate. If less than the entirety of a substrate side, in one embodiment, the area subjected to the flood exposing is at least 25% of the entirety of such substrate side. In one embodiment where the exposure to a pattern of activating radiation is conducted through a reticle, the area subjected to the flood exposing is at least twice the total area of one of opposing sides of the reticle. Other areas of flood exposure which encompass less than the entirety of one substrate side are also of course contemplated.

The activating radiation of the pattern dose and the activating radiation of the flood dose may be of the same frequency or may be of different frequencies. If of different frequencies, the activating radiation of the flood dose may be at a lower or higher frequency than that of the activating radiation of the pattern dose. Regardless, in one embodiment, the activating radiation of the flood dose and the activating radiation of the pattern dose are within 100 nm of each other. In one embodiment, the activating radiation of the flood dose and the activating radiation of the pattern dose are within 50 nm of each other, and in one embodiment within 25 nm of each other.

In accordance with embodiments of the invention, the pattern dose may occur over only a single continuous period of time or over multiple time-spaced periods of time. Likewise, in accordance with embodiments of the invention, the flood dose may occur over only a single continuous period of time, or over multiple time-spaced periods of time. For either, if over multiple time-spaced periods of time, the periods may be equal or at least two of the periods may be not equal.

Figure 5:
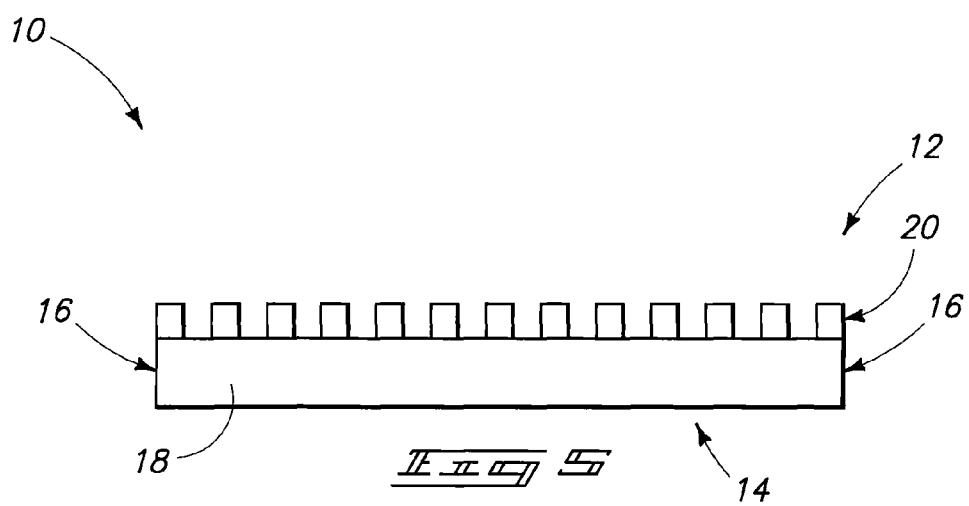
FIG. 5 is a view of the FIG. 4 substrate at a processing step subsequent to that shown by FIG. 4.

After exposing the area to the flood dose and the pattern dose, the area of the positive photoresist is developed to resolve the pattern in the positive photoresist. For example and by way of example only, FIG. 5 depicts the processed substrate of FIG. 4 having been developed with a suitable developer whereby the example pattern of FIG. 3 in positive photoresist 20 has been resolved and is usable. In the depicted FIG. 5 example, the developing has cleared all of the positive photoresist areas 26 (FIG. 3) within those portions of the area of the substrate that were exposed to the pattern dose. Alternately, the developing may not clear the entirety of the thickness of the positive photoresist within those portions of the area of the substrate that were exposed to the pattern dose. In such instance, the positive photoresist has still been patterned and may, for example, be used as a mask by first conducting a suitable short anisotropic etch of the photoresist to clear remaining of the pattern-exposed regions from being received over substrate 18.

The above example description and drawing sequence were with respect to one embodiment wherein the area was exposed to the patterned dose of an activating radiation prior to the stated flood exposing. However, such may be reversed wherein the area is subjected to the flood exposing prior to the pattern dose exposing. All other attributes as described above may apply regardless.

In one reduction-to-practice example, a silicon substrate was provided which had a bottom antireflective coating (BARC) received thereover, and which was covered by a positive photoresist 2895J available from JSR Micro Inc. of Sunnyvale, Calif. The positive photoresist had a thickness of 1,300 Angstroms. A reticle comprising a pattern of equally spaced lines having a pitch of 150 nm (thereby a CD of 75 nm) was to be used to pattern such layer of positive photoresist.

The activating radiation to be used was of a frequency of 193 nm. Such positive photoresist had an $E_0$ of about 4 mj. The photoresist when considered in the context of the example pattern had a Dose To CD of about 40 mj. In accordance with an embodiment of the invention, such positive photoresist was exposed to a pattern of activating radiation at 193 nm frequency at a dose of 33 mj, with such pattern dose thereby being about 83% of the Dose To CD. This was followed by a single flood exposure of the positive photoresist over the entirety of the side of the wafer to the same activating radiation at 193 nm frequency at a dose of 1 mj, which was less than $E_0$. The substrate was subsequently developed with a suitable developer, thereby replicating the reticle pattern into the photoresist.

Proceeding as described above may increase throughput through a photoscanner by reducing the amount of time required for each of the separate patternings with the reticle. For example, typical exposure tools pass incident radiation at constant quanta per unit of time at a selected frequency. Accordingly, to get a desired dose of exposure such as Dose To CD, such is a function of the time of exposure of the substrate to the incident radiation through the reticle. Providing a patterned dose below Dose to CD reduces the time required for the patterning dose, whether conducted with a photomask or reticle. Larger areas of the substrate encompassing more than a single reticle area can be subjected to a flood exposure, before or after the patterned exposure, which may enable the overall amount of time to pattern the substrate to be reduced. Further, the flood exposing of the area and the pattern exposing of the area may occur in the same tool or in different tools. If in different tools, the flood exposure may occur in a lower cost tool than is used for the pattern exposure.

One embodiment of the invention encompasses a method of reducing the time of exposing an area of a positive photoresist coating received over a substrate with pattern-effective activating radiation passed through a reticle. Such method comprises combining a flood exposure of the coating at a dose below $E_0$ with stepped pattern exposure of the coating through the reticle at dose below Dose To CD. In one embodiment, the flood dose is from 1% to 75% of $E_0$. In one embodiment, the sum of the flood dose and the pattern dose is less than the Dose To CD. The flood exposure may occur before or after the pattern exposure. Other attributes as described above also of course apply.

In the above example embodiments, some of the positive photoresist may or may not be removed between the exposings to activating radiation. However, no such removal is required. Further, a hardening or other anneal may or may not be conducted between the exposings to activating radiation. However, no such anneal(s) is required.

In compliance with the statute, the subject matter disclosed herein has been described in language more or less specific as to structural and methodical features. It is to be understood, however, that the claims are not limited to the specific features shown and described, since the means herein disclosed comprise example embodiments. The claims are thus to be afforded full scope as literally worded, and to be appropriately interpreted in accordance with the doctrine of equivalents.

The invention claimed is:

1. A method of patterning positive photoresist, comprising:
   providing positive photoresist over a substrate;
   exposing an area of the positive photoresist to a pattern of activating radiation at a dose which is below the Dose To Critical Dimension (CD) of said pattern with said positive photoresist, the pattern dose being less than or equal to 90% of said Dose To CD;
   flood exposing the area of the positive photoresist to activating radiation at a dose from 1% to 75% of Dose To Clear ($E_0$), sum of the flood dose and the pattern dose being less than said Dose To CD yet effective to resolve the pattern in the positive photoresist upon develop; and
   after exposing the area to the flood dose and the pattern dose, developing the area of the positive photoresist to resolve the pattern in the positive photoresist.

2. The method of claim 1 wherein the pattern dose is less than or equal to 80% of said Dose To CD.

3. The method of claim 1 wherein the flood dose is from 5% to 65% of $E_0$.

4. The method of claim 3 wherein the flood dose is from 10% to 50% of $E_0$.

5. The method of claim 1 wherein the flood dose is from 1 mj to 10 mj.

6. The method of claim 1 wherein the activating radiation of the pattern dose and the activating radiation of the flood dose are of the same frequency.

7. The method of claim 1 wherein the activating radiation of the pattern dose and the activating radiation of the flood dose are of different frequencies.

8. The method of claim 7 wherein the activating radiation of the flood dose is at a lower frequency than the activating radiation of the pattern dose.

9. The method of claim 7 wherein the activating radiation of the flood dose is at a higher frequency than the activating radiation of the pattern dose.

10. The method of claim 7 wherein the activating radiation of the flood dose and the activating radiation of the pattern dose are within 100 nm of each other.

11. The method of claim 10 wherein the activating radiation of the flood dose and the activating radiation of the pattern dose are within 50 nm of each other.

12. The method of claim 11 wherein the activating radiation of the flood dose and the activating radiation of the pattern dose are within 25 nm of each other.

13. The method of claim 1 wherein the developing clears all of the positive photoresist from being received over the substrate within those portions of the area that were exposed to the pattern dose.

14. The method of claim 1 wherein the pattern dose occurs over only a single continuous period of time.

15. The method of claim 1 wherein the flood dose occurs over only a single continuous period of time.

16. The method of claim 1 wherein the area subjected to the flood exposing is an entirety of one of opposing sides of the substrate.

17. The method of claim 1 wherein the area subjected to the flood exposing is less than an entirety of one of opposing sides of the substrate.

18. The method of claim 17 wherein the area subjected to the flood exposing is at least 25% of said entirety.

19. The method of claim 1 wherein the pattern dose is less than or equal to 70% of said Dose To CD.

20. The method of claim 1 wherein the flood exposure occurs before the pattern exposure.

21. The method of claim 1 wherein the flood exposure occurs after the pattern exposure.

22. A method of patterning positive photoresist, comprising:
   providing positive photoresist over a substrate;
   exposing an area of the positive photoresist to a pattern of activating radiation at a dose which is below the Dose To CD of said pattern with said positive photoresist, the pattern dose being from 50% to 95% of said Dose To CD;
   flood exposing the area of the positive photoresist to activating radiation at a dose from 1% to 75% of $E_0$, sum of the flood dose and the pattern dose being less than said Dose To CD yet effective to resolve the pattern in the positive photoresist upon develop; and
   after exposing the area to the flood dose and the pattern dose, developing the area of the positive photoresist to resolve the pattern in the positive photoresist.

23. The method of claim 22 wherein the flood exposure occurs before the pattern exposure.

24. The method of claim 22 wherein the flood exposure occurs after the pattern exposure.

25. A method of patterning positive photoresist, comprising:
   providing positive photoresist over a substrate;
   exposing an area of the positive photoresist to a pattern of activating radiation at a dose which is below the Dose To CD of said pattern with said positive photoresist;
   flood exposing the area of the positive photoresist to activating radiation at a dose from 1% to 75% of $E_0$, sum of the flood dose and the pattern dose being less than said Dose To CD yet effective to resolve the pattern in the positive photoresist upon develop, the flood dose occurring over multiple time spaced periods of time that are equal; and
   after exposing the area to the flood dose and the pattern dose, developing the area of the positive photoresist to resolve the pattern in the positive photoresist.

26. The method of claim 25 wherein the flood exposure occurs before the pattern exposure.

27. The method of claim 25 wherein the flood exposure occurs after the pattern exposure.

28. A method of patterning positive photoresist, comprising:
   providing positive photoresist over a substrate;

exposing an area of the positive photoresist to a pattern of activating radiation at a dose which is below the Dose To CD of said pattern with said positive photoresist;

flood exposing the area of the positive photoresist to activating radiation at a dose from 1% to 75% of $E_0$, sum of the flood dose and the pattern dose being less than said Dose To CD yet effective to resolve the pattern in the positive photoresist upon develop, the flood dose occurring over multiple time spaced periods of time at least two of which are not equal; and after exposing the area to the flood dose and the pattern dose, developing the area of the positive photoresist to resolve the pattern in the positive photoresist.

29. The method of claim 28 wherein the flood exposure occurs before the pattern exposure.

30. The method of claim 28 wherein the flood exposure occurs after the pattern exposure.

31. A method of patterning positive photoresist, comprising:

providing positive photoresist over a substrate;

exposing an area of the positive photoresist to a pattern of activating radiation at a dose which is below the Dose To CD of said pattern with said positive photoresist;

flood exposing the area of the positive photoresist to activating radiation at a dose from 1% to 75% of $E_0$, sum of the flood dose and the pattern dose being less than said Dose To CD yet effective to resolve the pattern in the positive photoresist upon develop, the exposing to a pattern of activating radiation is conducted being conducted through a reticle, the area subjected to the flood exposing being at least twice the total area of one of opposing sides of the reticle; and after exposing the area to the flood dose and the pattern dose, developing the area of the positive photoresist to resolve the pattern in the positive photoresist.

32. The method of claim 31 wherein the flood exposure occurs before the pattern exposure.

33. The method of claim 31 wherein the flood exposure occurs after the pattern exposure.

* * * * *

UNITED STATES PATENT AND TRADEMARK OFFICE
CERTIFICATE OF CORRECTION

PATENT NO. : 8,124,326 B2  
APPLICATION NO. : 12/396941  
DATED : February 28, 2012  
INVENTOR(S) : Paul D. Shirley et al.

Page 1 of 1

It is certified that error appears in the above-identified patent and that said Letters Patent is hereby corrected as shown below:

In column 8, line 9, in Claim 31, after "radiation" delete "is conducted".

Signed and Sealed this  
Eighth Day of May, 2012

David J. Kappos  
*Director of the United States Patent and Trademark Office*